(12) United States Patent
Niiya

(10) Patent No.: US 7,838,103 B2
(45) Date of Patent: Nov. 23, 2010

(54) PATTERNED MEMBER AND PRODUCTION METHOD THEREOF

(75) Inventor: Hirotaka Niiya, Soraku-gun (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 970 days.

(21) Appl. No.: 11/130,282

(22) Filed: May 17, 2005

(65) Prior Publication Data

US 2005/0259139 A1 Nov. 24, 2005

(30) Foreign Application Priority Data

May 18, 2004 (JP) .............................. 2004-148315

(51) Int. Cl.
*B32B 7/02* (2006.01)
(52) U.S. Cl. .................... 428/213; 428/195.1; 428/215; 428/216; 315/340; 315/312
(58) Field of Classification Search ......... 349/106–111; 428/195.1, 161, 213, 215, 216; 315/340–312
See application file for complete search history.

(56) References Cited

U.S. PATENT DOCUMENTS

| | | | |
|---|---|---|---|
| 5,670,205 A | | 9/1997 | Miyazaki et al. |
| 5,904,576 A | * | 5/1999 | Yamaha et al. .............. 438/788 |
| 6,025,898 A | * | 2/2000 | Kashiwazaki et al. ....... 349/106 |
| 6,224,205 B1 | | 5/2001 | Akahira et al. |
| 6,399,257 B1 | * | 6/2002 | Shirota et al. .................. 430/7 |
| 6,630,274 B1 | * | 10/2003 | Kiguchi et al. ................. 430/7 |
| 6,783,208 B2 | | 8/2004 | Kawase et al. |
| 7,214,617 B2 | * | 5/2007 | Hirai .......................... 438/676 |
| 2001/0007733 A1 | | 7/2001 | Matsuyama et al. |
| 2003/0113639 A1 | | 6/2003 | Kawase |
| 2005/0084777 A1 | | 4/2005 | Kawase |

FOREIGN PATENT DOCUMENTS

| | | |
|---|---|---|
| JP | 07-318723 A | 12/1995 |
| JP | 08-304619 | 11/1996 |
| JP | 09-021910 | 1/1997 |
| JP | 09-101411 A | 4/1997 |
| JP | 10-123310 | 5/1998 |
| JP | 2001-288578 A | 10/2001 |
| JP | 2002-250811 A | 9/2002 |
| JP | 2003-021714 | 1/2003 |
| JP | 2003-066222 A | 3/2003 |
| JP | 2003-182110 A | 7/2003 |
| JP | 2003-318516 A | 11/2003 |

OTHER PUBLICATIONS

Katsuyuki Morii et al.; "Film Formation by Inkjet—Behavior of Inkjet Droplets"; Hyoumen Kagaku, vol. 24, No. 2, pp. 90-97, 2003.

* cited by examiner

*Primary Examiner*—Bruce H Hess
*Assistant Examiner*—Tamra L. Amakwe
(74) *Attorney, Agent, or Firm*—Birch, Stewart, Kolasch & Birch, LLP

(57) ABSTRACT

A first ink discharging is carried out onto picture element regions on a glass substrate, picture element regions being components divided off by a black matrix in a fine region. Drying of ink forms an ink film whose layer thickness is thick at a surrounding section and thin at a midsection. Further, second ink discharging is carried out on the first ink film and by drying ink discharged in the second ink discharging, an ink layer which has a flat surface is formed.

6 Claims, 5 Drawing Sheets

(a)

(b)

(c)

(d)

▩ ··· LARGE FILM THICKNESS

▨ ··· SMALL FILM THICKNESS

PICTURE ELEMENTS WHERE LEAK OCCURS

PICTURE ELEMENTS WHERE INK IS REMOVED

DRYING

PATTERNED MEMBER AND PRODUCTION METHOD THEREOF

This Nonprovisional application claims priority under 35 U.S.C. §119(a) on Patent Application No. 2004/148315 filed in Japan on May 18, 2004, the entire contents of which are hereby incorporated by reference.

FIELD OF THE INVENTION

The present invention relates to a patterned member having a fine pattern in a fine region and a production method thereof. Examples of the above-mentioned patterned member are a color filter used in a liquid crystal display device, a wiring substrate on which a metal wiring pattern is formed, and the like patterned members.

BACKGROUND OF THE INVENTION

In recent years, application of liquid crystal display devices to OA instruments (office automation instruments such as personal computers), portable information terminals, televisions and the like have been rapidly increased. Such a liquid crystal display device employs a color filter in order to perform color display. In general, the color filter has three primary colors of light; Red (R), Green (G) and Blue (B). The color filter is formed on a transparent substrate so that the color filter has a pattern.

Broadly known conventional production methods of the color filter are a pigment dispersion method and a staining method. The pigment dispersion method includes the steps of: (i) applying color resists on a transparent substrate; (ii) exposing the color resists to light; and (iii) developing the color resists, thereby to form a pattern of a color layer. The staining method includes the steps of: (i) applying a dying assistant on the transparent substrate; (ii) exposing the dying assistant to light; (iii) developing the dying assistant, thereby to form a pattern; and (iv) staining the pattern, thereby to obtain a color layer. However, these production methods need to repeat, for each color, each process of washing, applying, exposing and developing. Thus, simplification of the process is difficult. Further, spin coating in the step of applying increases an amount of material loss.

Other production methods of a color filter other than the above-mentioned are, e.g. an electrodeposition method, a printing method, and other methods. The electrodeposition method forms a transparent electrode pattern on a transparent substrate and carries out electro-deposition by supplying electricity to the transparent electrode while soaking the transparent substrate in respective electrolytes of respective colors. The printing method forms a color layer by printing each color on a transparent substrate. However, the electrodeposition method has a problem in that the pattern that can be formed by this method is limited. The printing method also has a problem in that it is difficult to form a very fine pattern.

In contrast to each of the color filter production method mentioned above, an inkjet method does not need an exposure process and a development process because in the inkjet method a pattern is formed directly by discharging (i.e. jetting out) ink onto the transparent substrate from an inkjet head moving over the transparent substrate. Accordingly, because the inkjet method makes it possible to reduce cost by reducing an amount of the ink to use and simplifying the process, the inkjet method currently draws attention as a color filter production method. In the inkjet method, the formation of the color layer by the discharging of the ink is carried out in various ways. For example, the ink is jetted out into a plurality of concave sections surrounded by divider members provided on the transparent substrate. In an other case, for example, a water repellent pattern region and a hydrophilic pattern region are provided on the transparent substrate in advance of the discharging of the ink, so that a color layer that has a precise pattern is formed by discharging the ink. Furthermore, in still an other case, the ink is jetted onto a display section after an amount of a jetted-out droplet and a landing position of the droplet is stabilized by preliminarily discharging the ink onto a non-display section which will not be used for displaying. (For example, Japanese Laid-Open Patent Application Publication 1995/318723 ((Tokukaihei 7-318723, published on Dec. 8, 1995): hereinafter, referred to as Patent Document 1)

Other documents describing conventional arts are as follows:

Japanese Laid-Open Patent Application Publication 2002/250811 ((Tokukai 2002-250811, published on Sep. 9, 2002) hereinafter, referred to as Patent Document 2);

Japanese Laid-Open Patent Application Publication 2003/21714 ((Tokukai 2003-21714, published on Jan. 24, 2003): hereinafter, referred to as Patent Document 3);

Japanese Laid-Open Patent Application Publication 1997/101411 ((Tokukaihei 9-101411, published on Apr. 15, 1997): hereinafter, referred to as Patent Document 4);

Japanese Laid-Open Patent Application Publication 1997/21910 ((Tokukaihei 9-21910, published on Jan. 21, 1997): hereinafter, referred to as Patent Document 5);

Japanese Laid-Open Patent Application Publication 1996/304619 ((Tokukaihei 8-304619, published on Nov. 22, 1996): hereinafter, referred to as Patent Document 6);

Japanese Laid-Open Patent Application Publication 1998/123310 ((Tokukaihei 10-123310, published on May 15, 1998): hereinafter, referred to as Patent Document 7); and Hyoumen Kagaku, Vol. 24, No. 2, pp. 90-97, 2003: hereinafter, referred to as Non-Patent Document 1).

However, the color filter production using the inkjet method has a problem in that the ink, which has landed on the transparent substrate, is dried hardly with an even film thickness all over the display section. This results in uneven distribution of the ink, as explained as follows.

FIG. 6 is a sectional view of a color filter. FIG. 6 illustrates a color filter production process using a conventional inkjet method. In the color filter production process using conventional inkjet method, the color filter is formed by discharging ink 103 out so that the ink 103 lands on a substrate 101, on which a black matrix 102 is formed.

The ink 103 used in the inkjet method needs to spread all over a hydrophilic part of the substrate 101, after the ink 103 lands on the substrate 101 on which a black matrix 102 is formed. Thus, not low viscosity ink but ink of high fluidity is generally used as the ink 103. If the ink 103 landed on a picture element region was leaked into another adjacent picture element region, the leakage would cause color mixing, the picture element regions separated by the black matrix 102. The black matrix 102 normally has water repellent property in order to prevent the leakage. In this case, the ink 103 that has landed on a predetermined picture element on the substrate 101 forms a convex shape whose midsection has a large thickness in the picture element region. When the color filter is completed by drying the ink 103, the dried ink 103 keeps the convex shape that it has right after the landing.

In the case where the ink (that is, a color layer) has a convex shape on the above color filter as described above, various problems occur, which do not occur in a color filter whose color layer is formed with an even thickness. The various problems are: uneven cell thickness, diminishment of color in a vicinity of the black matrix, uneven distribution of color deepness in the picture element region and the like.

In the above Patent Documents 1 through 3, the shape of the ink layer formed in each picture element region is not specifically described. In the Patent Document 5, although it is described that the ink dried on the substrate forms a convex shape, a problem resulting from this shape of the ink and a method of solving the problem are not disclosed.

In Patent Documents 6 and 7, exemplary methods for compensating the convex shape of the ink are disclosed. The method proposed in Patent Document 6 is a method according to which negative-type photo-curing resin is applied onto a color filter including a convex-shaped ink layer and then exposed to light incident thereon from above a backside of the color filter. In this way, a convex section level of the color filter is leveled off spontaneously. The method proposed in Patent Document 7 is a method according to which, after forming the ink layer on the substrate by the inkjet method firstly, a black matrix is formed by a photo-lithography process.

By the method proposed in Patent Document 6, a convex section level is evened (leveled off). However, because the another problem, that is, the problem in which the ink thickness close to the black matrix becomes thin, cannot be solved, uneven distribution of color deepness cannot be dissolved. The diminishment of the color in the vicinity of the black matrix is also left unsolved.

According to the method proposed in Patent Document 7, the ink layer is formed directly on the glass substrate by the use of the inkjet method. When forming the ink layer, the black matrix that serves a bank is not provided. Accordingly, the problem such as the color diminishment close to the black matrix does not occur. However, because accurate formation of each section of the colors is difficult in consideration of precision of landing an ink droplet, and the other factor, it becomes further difficult to apply this method to formation of a color filter of a very fine pattern.

SUMMARY OF THE INVENTION

An object of the present invention is to provide a patterned member and a production method of the same, the patterned member including thereon a fine pattern in a fine region, the pattern having an even film thickness. Examples of the patterned member are (i) a color filter, which is used for a liquid crystal display, (ii) a wiring substrate, on which a metal wiring pattern is formed, and the like.

In order to attain the object, a patterned member including a pattern layer patterned within a fine region on a substrate, is arranged such that the pattern layer includes a plurality of films that are laminated in a direction of a substrate normal line and that have an interface therebetween; and (i) top one of the films has a flat top surface, and (ii) rest of the films has a film thickness thick at a surrounding section and thin at a midsection.

In order to attain the object, a production method of a patterned member, the method comprising the steps of (a) discharging or applying a liquid material onto a substrate, so as to form a pattern in a fine region, and (b) drying the liquid material, so as to form a pattern layer on the substrate, the pattern layer having a fine pattern, is arranged such that the step of discharging or applying and the step of drying are divided into plural times, and form the pattern layer such that the pattern layer includes a plurality of films that are laminated in a direction of a substrate normal line and that have an interface therebetween; and the step of drying dries the film such that (i) top one of the films has a flat top surface, and (ii) rest of the films has a film thickness thick at a surrounding section and thin at a midsection.

In the above arrangement, the pattern layer has a laminated structure including a plurality of films. The films are formed by performing drying between discharging (or jetting out) or applying of the liquid material for each film. Except the top one of the films, the rest of the films has a shape that film thickness is thick at the surrounding section and thin at the midsection and the top one of the films has a flat surface. This prevents the surface of the pattern layer finally attained from having a convex shape even in case of the pattern layer formed in a fine region. As the result, a flat pattern layer (a pattern layer whose film thickness is even) can be attained.

For a fuller understanding of the nature and advantages of the invention, reference should be made to the ensuing detailed description taken in conjunction with the accompanying drawings.

DESCRIPTION OF THE EMBODIMENTS

First Embodiment

An exemplary embodiment (hereinafter, the present embodiment in [First Embodiment]) of the present invention is explained, by referring to FIGS., as follows. In the first exemplary embodiment, a color filter is exemplified as a patterned member to which the present invention is applied. Firstly, referring to FIGS. 1(a) through 1(d) and FIGS. 2(a) through 2(c), color filter production is explained.

Figure 1:
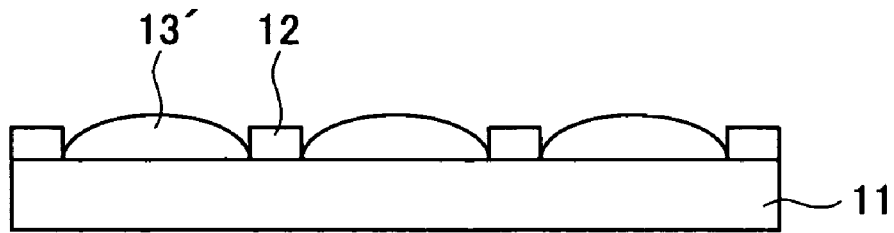
FIGS. 1(a) through 1(d) are sectional views illustrating color filter production process.
Figure 1:
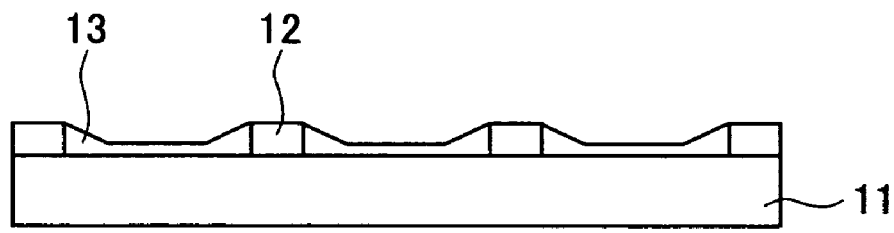
Figure 1:
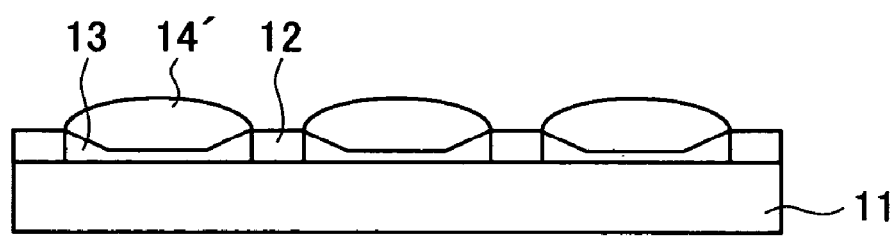
Figure 1:
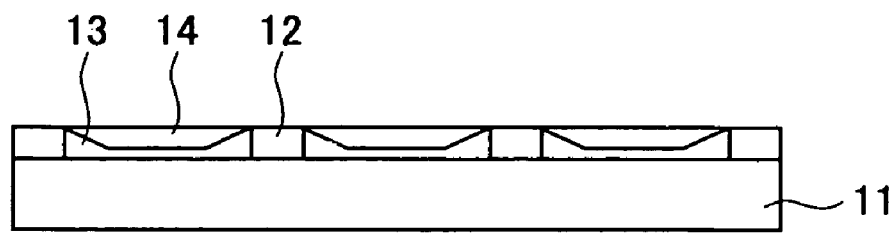
Figure 2:
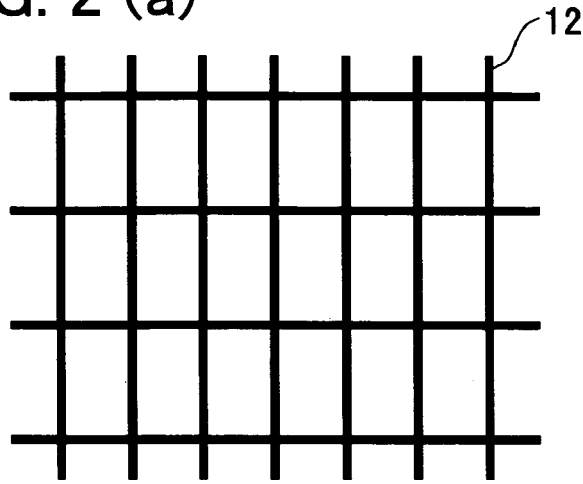
FIGS. 2(a) through 2(c) are plan views illustrating the color filter production process.
Figure 2:
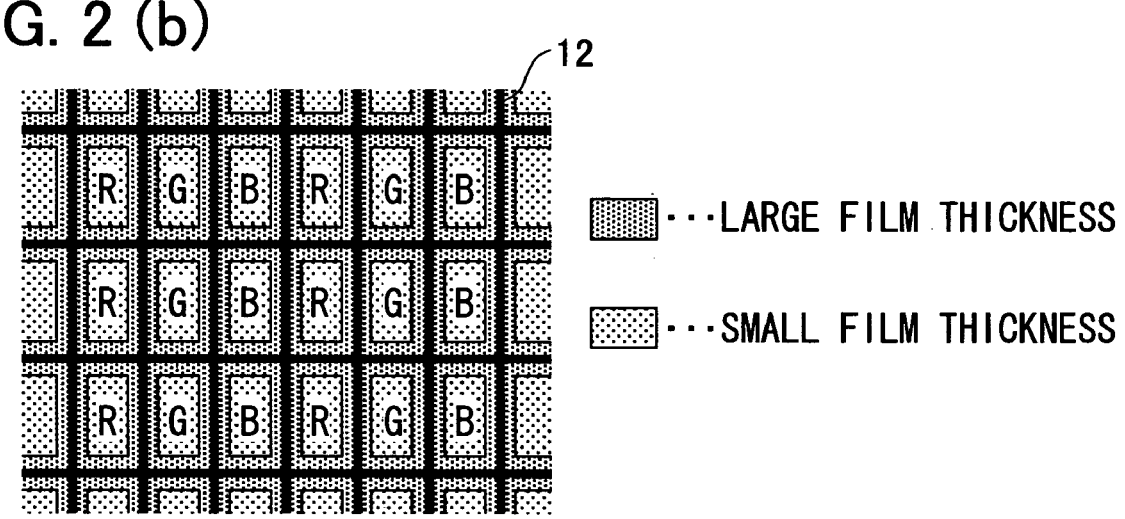
Figure 2:
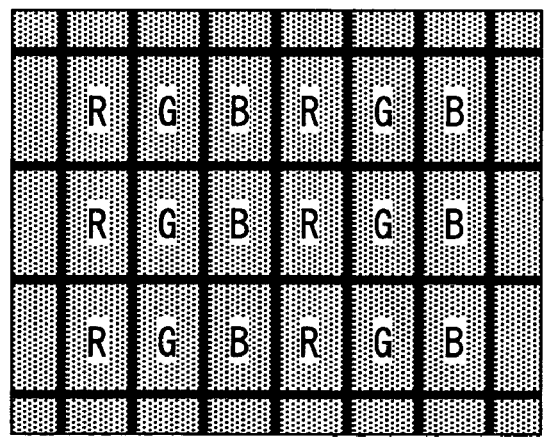

First, as in FIGS. 1(a) and 2(a), on the glass substrate 11 (refer to FIG. 1(a)), a black matrix 12 of a dot pattern is formed with a negative-type black matrix resist material by a photo-lithography method. In the formation of the black matrix 12, a material and a process for forming the black matrix 12 are not limited particularly although the resist material and the photo-lithography process are used in order to form the black matrix 12 in this embodiment. Any material and process may be employed as long as the material and the process allows the formation of the black matrix. Also, the pattern of black matrix pattern is not limited to the dot pattern; arrangement of a color filter formed is not particularly limited (e.g. the arrangement may be dot arrangement, stripe arrangement, mosaic arrangement, delta arrangement or the like).

The black matrix 12 after formation of the pattern is subjected to plasma treatment with a gas containing F atoms ($CF_4$ gas or the like) and the surface of the black matrix 12 is subjected to ink repelling treatment (a treatment for causing the black matrix 12 to have ink repelling property). The black matrix 12 may be caused to have an ink repelling property by other than the above-mentioned plasma treatment, e.g., by adding an ink repellent agent in a black matrix material, provided that the black matrix material becomes more ink-repellent than the glass substrate 11.

Next, as in FIG. 1(a), first ink discharging is carried out by an inkjet device. By the first ink discharging, inks are jetted onto the dot pattern (i.e. a dot of the dot pattern (i.e. the dot is a compartment of the dot pattern that is divided off by the black matrix 12) of the ink repelling black matrix 12. The inks are color materials (RED, GREEN, and BLUE), in which pigments are dispersed respectively. The color materials are inks 13', whose viscosity, surface tension and the like are adjusted for the ink-discharging (For example, the inks 13' are adjusted to have a viscosity of 10 Pa·s and a surface tension of 30 mN/m).

After the above-mentioned first ink discharging is completed, the inks 13' are dried, thereby forming a first ink film 13 of an ink layer as illustrated in FIGS. 1(b) and 2(b). In this ink drying process, the first ink film 13 formed by the first ink discharging is dried to have such a shape that film thickness in a vicinity of the black matrix 12 (that is, a fringe section in the dot) is thick and the film thickness at a midsection is thin (i.e. the ink material is unevenly distributed: more in the vicinity of the black matrix than in the midsection). Because of this shape a color filter having a flat surface will be attained later on. The drying of the ink can be performed efficiently by employing a drying method that utilizes RTA (Rapid Thermal Annealing), a HP (Hot Plate), an oven, a reduced pressure or the like. However, the ink may be dried naturally instead of using drying apparatus.

Ink droplets of a small amount, jetted out by the inkjet method or the like, is greatly affected from on a surrounding environment as is described in Non-Patent Document 1. Therefore, the shape in which the ink material is unevenly distributed to be more in the vicinity of the black matrix than in the midsection can be easily attained by changing a drying condition and a drying method. In this embodiment, this shape of the dried first ink film 13 is attained by using the HP after the first ink discharging.

Then, as illustrated in FIG. 2(c) (see FIG. 1 (c)), second ink discharging is carried out thereby to discharge an ink 14' onto the first ink film 13 thus formed in this way. By drying the ink 14', a second ink film 14 of the ink layer is formed (see FIG. 1(d)).

In a drying process of the second ink film 14, the condition of drying and the drying method are controlled so that a surface of the formed color filter, that is, a surface of the second ink film 14 becomes flat. In this embodiment, the color filter is baked in an oven after the shape is produced by drying the ink 14' under reduced pressure. Like the first ink film, the second ink film 14 may be dried by employing the RTA, the HP, the oven, reduced pressure or the like, or may be dried naturally.

Although a desired shape is attained by controlling the drying conditions and the drying methods in the drying steps of the ink films 13 and 14, it is extremely difficult to attain a flat surface on the glass substrate by drying the ink layer formed thereon by single ink discharging, the glass substrate having a flat surface. In the above-method, the ink discharging is carried out twice so that the two steps of forming the films included in the ink layer respectively are carried out with the step of drying provided between the two steps of forming two ink film. With this method, an ink layer that has a flat plain surface can be attained finally after the steps of forming the films and of drying.

Although the two films, that is, the first ink film 13 and the second ink film 14, are made from the inks that are basically made of identical materials, an interface intervenes between the films 13 and 14 due to the step of drying between the step of forming the two ink films. Therefore, the color filter of the present embodiment can be considered to have a laminate structure produced by the films laminated in the dot (picture element region) of the dot pattern.

In this way, the color filter of the present embodiment has a two-layer structure made of the first ink film 13 and the second ink film 14 in the dot (picture element region) of the dot pattern. The first ink film 13 (that is adjacent to the substrate) included in the ink layer is formed so that the film thickness at the fringe section becomes thick and the film thickness at the midsection becomes thin and the second ink film 14 (that forms the surface of the film) included in the ink layer is formed so that the surface of the second ink film 14 becomes flat. As a result, the ink layer of the color filter can have substantially the same film thickness at both of the fringe section and the midsection (the film thickness can be substantially even overall). This solves a conventional problem in that insufficient film thickness in the vicinity of the black matrix and the filter has a convex shape.

In the above-mentioned example, in each of the first ink film and the second ink film included in the ink layer, after the inks of three colors are jetted out, the inks are dried at the same time. However, the processes from the ink discharging to the ink drying may be carried out by one color at a time. Also, colors of the color filter are not limited to the three colors, RED, GREEN and BLUE. No problem is posed by a color filter of multi-elementary-colors.

Moreover, in the method mentioned above, although the ink discharging by the inkjet method is adopted for applying ink before drying, the color filter production method is not specifically limited. Other than the inkjet method, a printing method or the like may be used for applying ink before drying.

Second Embodiment

In this second exemplary embodiment, an example applying the present invention to correction technology for a color filter is illustrated.

After a pattern is plotted directly on a substrate with liquid ink by an inkjet method, a printing method or the like method, the color filter of the present embodiment 2 forms the pattern by drying the ink. There exists a case that leak (color mixture) between adjacent picture elements occurs in production in which a color filter production method using an inkjet method, a printing method, or the like is used in the way mentioned above.

Figure 3:
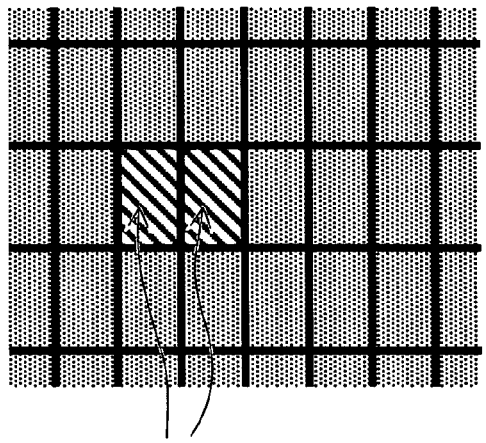
FIGS. 3(a) through 3(d) are plan views illustrating a step of correcting a leak section of a color filter.
Figure 3:
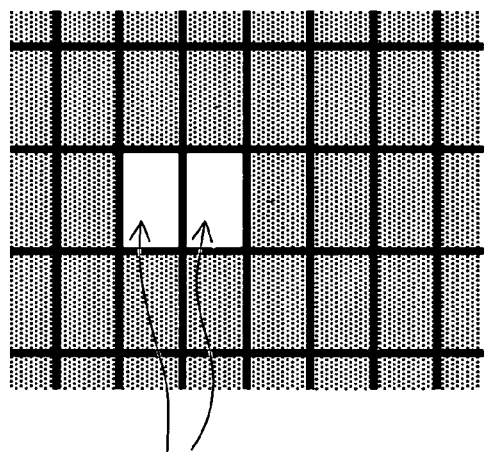
Figure 3:
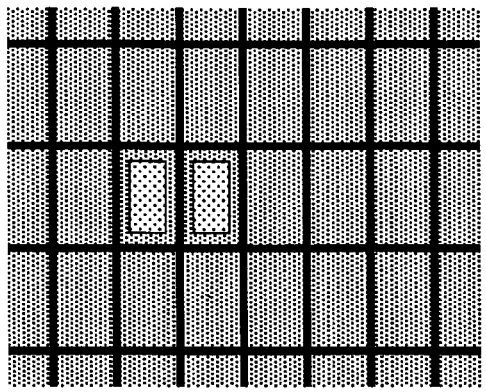
Figure 3:
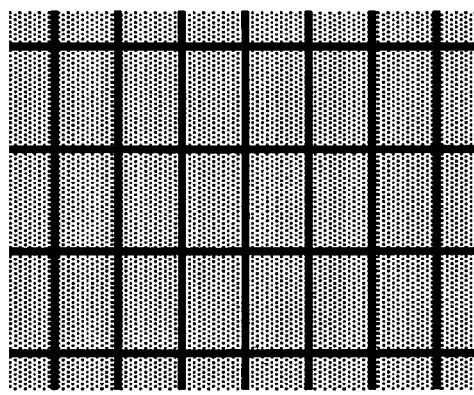

In order to correct the color filter (c.f. FIG. 3(a)), on which such a leak has occurred, ink at a leak section is removed by laser (c.f. FIG. 3(b)). After the removal, the color filter is subjected to plasma treatment with a gas containing F atoms in the same way as in the color filter production. With this treatment, a black matrix around a section from which the ink is removed becomes water repellant.

Then, by the inkjet method the ink is jetted onto a picture element from which the ink is removed. However, in this case, due to factors such as influence from the residual materials resulting from the correction by laser, it is not possible to attain water repellent property as high as that obtained when the color filter is formed. As the result, the corrected picture element is thinner than other picture elements around the corrected picture element.

Because of this, in the embodiment 2, the present invention is applied in forming the ink layer on a picture element to be corrected. Namely, (i) onto the picture element from which the ink is removed, the ink is jetted in plural times in small amounts at each ink discharging and (ii) repeating the ink discharging and drying plural number of times. With this, it is possible to correct the picture element with leak to have the same film thickness and shape as the picture elements around this picture element. Of course, a drying condition is controlled in this case so that the ink film included in the ink layer other than the top ink film (a layer that forms a surface of the ink layer) has a shape that the ink material is distributed more in the vicinity of the black matrix and less in the midsection.

Third Embodiment

The exemplary embodiments 1 and 2 discuss the examples that the present invention is applied to the color filter production. This exemplary embodiment 3 deals with an example that the present invention is applied to wiring formation in which a metal material is jetted out, by using an inkjet method, onto a TFT (Thin Film Transistor) substrate that is used for a flat panel display and the like. In this exemplary embodiment 3, a width of metal wiring formed by the inkjet method is so thin that use of conventional method results in a convex shape whose thickness varies along a width direction (in other words, the metal wiring has a convex shape cross-sectionally). Because of this, the metal wiring in this exemplary embodiment 3 can be considered as a pattern layer formed in a very small region. How a wiring is formed on the TFT substrate is explained, referring to FIGS. 4(a) through 4(c).

First, a channel 22 is formed on a glass substrate 21 as illustrated in FIG. 4(a). Onto the channel 22, a wiring material is to be jetted. Although this channel may be formed by forming a channel on laminated films prepared by laminating materials of a SOG (Spin On Glass) film or the like on the glass substrate 21, here the channel is directly formed on the glass substrate 21 by wet etching. Even in the case that the channel formation process is carried out directly onto the glass substrate, the channel formation is not limited to the wet etching in terms of its processing method.

For larger panel size and higher definition, low resistance and low capacitance are demanded in the TFT substrate. Thus, the wiring formed needs to be as thin as possible and large in thickness. Considering a layer to be provided on the wiring, it is desirable in the wiring formation that the wiring is formed with no level difference. In view of this, proposed is the process of forming firstly a channel on the glass substrate beforehand and then mounting the wiring in the channel section.

Figure 5:
FIG. 5 is a sectional view of a wiring substrate produced by a conventional method.
Figure 6:
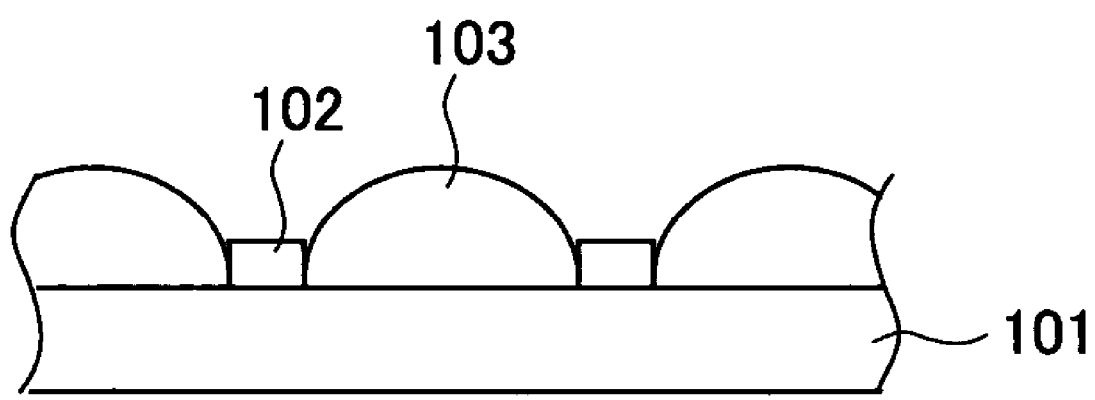
FIG. 6 is a sectional view illustrating a conventional color filter production process.
Figure 6:
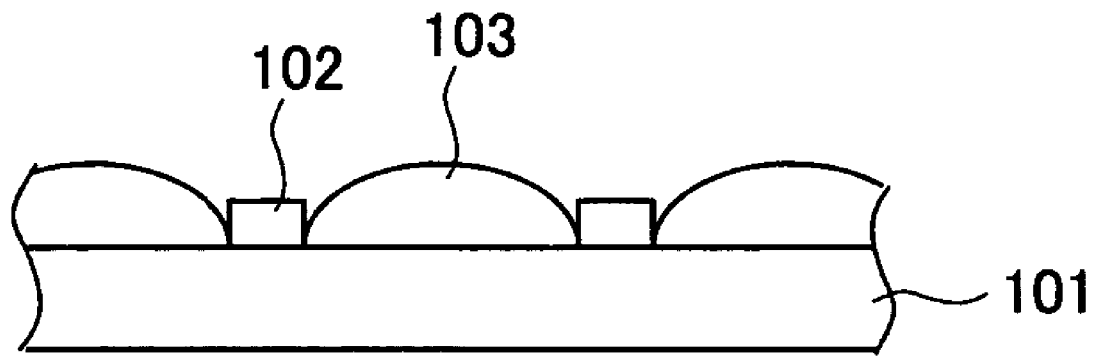

Here, if a conventional method (a method in which the steps of discharging and drying are carried out only once) is used in a wiring formation process in which (i) a metal material (a liquid metal material in which metal particles are dispersed in a solvent) is jetted into the channel of the glass substrate and (ii) the metal material is dried to be metal wiring, the metal wiring formed in the channel has a convex shape cross-sectionally. The convex shape results in a space between the channel and the wiring (c.f. the FIG. 5). Because this space causes a level difference with respect to the upper layer, this space may be a cause of trouble (such as disconnection and the like) in a wiring in the upper layer.

Figure 4:
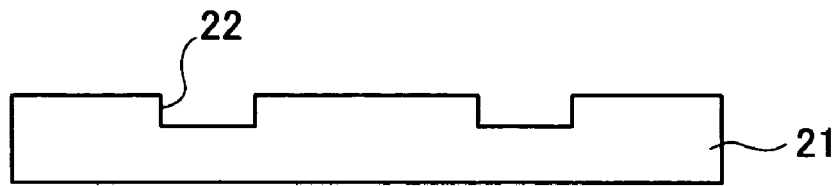
FIGS. 4(a) through 4(c) are sectional views illustrating steps of wiring substrate production.
Figure 4:
Figure 4:
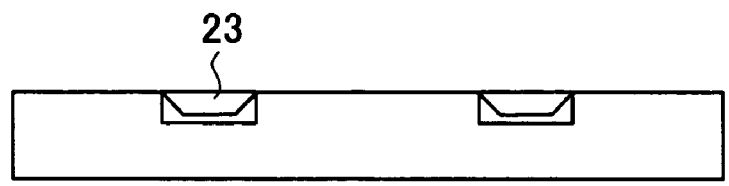

In order to solve this problem, the TFT substrate of this exemplary embodiment 3 is arranged such that after first discharging of the wiring material into the channel 22, the wiring material jetted out in the first discharging is dried, so that the wiring close to sides of the channel 22 is thicker as illustrated in FIG. 4. After this, second discharging of the wiring material is carried out and the wiring material jetted out in the second discharging is dried as illustrated in the FIG. 4(c). In this way, it possible to attain a flat wiring layer 23 that fills up and levels out a section of the channel 22.

The embodiments 1 through 3 are arranged such that a bank (a bank section) such as a black matrix, the channel and the like are formed around a pattern layer formed (an ink layer or a metal wiring layer). However, in the present invention, formation of such a bank is not necessarily required. Namely, even if the above bank layer is absent in formation of a first pattern film (a firstly formed layer included in a pattern layer), it is possible by controlling the drying method and the drying condition to produce the first pattern film with a shape that a film thickness at a surrounding section is thick and a film thickness at a midsection is thin. Then a second pattern film (a secondary formed layer included in the pattern layer) is formed on the first pattern film having the shape. The pattern layer thus formed attains a film thickness substantially even and flat overall.

Although any of the pattern layers formed in the exemplary embodiments 1 through 3 has a two-layer structure, the pattern layer in the present invention may have a laminated structure which includes at least two films. Namely, in the case the pattern layer has a laminated structure that includes more than two films, only a pattern film that becomes a top film needs to have a flat surface. Accordingly, in such a case, the drying condition is controlled so that the pattern films other than the top film have a film thickness thick in the surrounding section thin at the midsection is thin.

Kinds of patterned members to which the present invention is applicable is not limited to the color filter or the wiring substrate in the embodiments 1 through 3 explained above. Namely, the present invention is applicable to any patterned member that is produced by forming a pattern layer on a substrate by (a) applying a liquid material to a fine region to form a pattern on a substrate and (b) drying the liquid material. One of other examples of the patterned member to which the present invention is applicable is an organic EL (Electro Luminescence) panel. In the case of an organic EL panel production, the present invention is applicable when an organic EL layer is produced by pattern formation on a glass substrate.

In an example in which the present invention is applied in order to form a metal pattern layer, the present invention is applicable to not only formation of the metal wiring as in the exemplary embodiment 3 but also, for example, formation of pixel electrodes on an active matrix substrate.

With regard to the method of discharging (or applying) a liquid pattern layer material onto the substrate, the method is not particularly limited and if a method is capable of forming a desired pattern by a liquid pattern layer material, the method may be used. Other than the above-mentioned inkjet method, for example, a transfer method or a spin coat method can be used. In the case where a liquid pattern layer material is applied to a substrate by the spin coat method, the pattern layer material can form a desired pattern if a pattern is formed on the substrate by a bank or the like beforehand.

In the present invention, though the above-mentioned pattern layer has a laminated structure, a function of each film is not different substantially (For example, concerning a color filter, ink films of the same color are laminated). Each film may be different in a material property such as viscosity or the like at discharging (or applying) a liquid pattern layer material for each film.

As mentioned above, a patterned member according to the present invention including a pattern layer patterned within a fine region on a substrate, is arranged such that the pattern layer includes a plurality of films that are laminated in a direction of a substrate normal line and that have an interface therebetween; and (i) top one of the films has a flat top surface, and (ii) rest of the films has a film thickness thick at a surrounding section and thin at a midsection.

A production method, according to the present invention, of a patterned member, the method comprising the steps of (a) discharging or applying a liquid material onto a substrate, so as to form a pattern in a fine region, and (b) drying the liquid material, so as to form a pattern layer on the substrate, the pattern layer having a fine pattern, is arranged such that the step of discharging or applying and the step of drying are divided into plural times, and form the pattern layer such that the pattern layer includes a plurality of films that are laminated in a direction of a substrate normal line and that have an interface therebetween; and the step of drying dries the film such that (i) top one of the films has a flat top surface, and (ii) rest of the films has a film thickness thick at a surrounding section and thin at a midsection.

Accordingly, the pattern layer mentioned above has a laminated structure including plural number of films. Each of the films is formed in the processes including the drying process that intervenes between two successive liquid material discharging operations or applications. The film other than the top film has a shape that film thickness is thick at the surrounding section and thin at the midsection and the top film has a shape that the surface of the film is flat. This prevents that the surface of the pattern layer finally attained becomes a convex shape even if the pattern layer is subjected to pattern formation in the fine region. As the result, a flat pattern layer (a pattern layer whose film thickness is even) can be attained.

In the patterned member and the production method of the same, it is preferable that each film laminated in the pattern layer has a same function.

In the patterned member and the production method of the same, the patterned member may be a color filter and the pattern layer is an ink layer, or the patterned member may be a wiring substrate and the pattern layer is a metal wiring layer.

In the patterned member and the production method of the same, the pattern layer may be formed in the fine region surrounded by a bank. According to the arrangement mentioned above, the pattern layer can be formed very finely in the fine region.

In the production method of the patterned member, it is preferable that an inkjet method is used as a method for discharging the liquid material onto the substrate.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A patterned member including a fine pattern layer patterned within a fine region on a substrate, wherein:
   said fine pattern layer includes a plurality of films that are laminated in a direction of a substrate normal line and that have an interface therebetween; and
   (i) a top one of the plurality of films has a flat top surface, and (ii) the plurality of films other than said top one are directly below said top one and have a concave surface such that film thickness at a surrounding section is thicker than the film thickness at a midsection, wherein:
   each film laminated in said fine pattern layer has a same function.

2. The patterned member as in claim 1, wherein:
   said patterned member is a color filter and said fine pattern layer is an ink layer.

3. The patterned member as in claim 1, wherein:
   said patterned member is a wiring substrate and said fine pattern layer is a metal wiring layer.

4. A patterned member including a fine pattern layer patterned within a fine region on a substrate, wherein:
   said fine pattern layer includes a plurality of films that are laminated in a direction of a substrate normal line and that have an interface therebetween; and
   (i) a top one of the plurality of films has a flat top surface, and (ii) the plurality of films other than said top one are directly below said top one and have a concave surface such that film thickness at a surrounding section is thicker than the film thickness at a midsection, wherein:
   said fine pattern layer is formed in the fine region surrounded by a bank.

5. The patterned member as in claim 4, wherein:
   said patterned member is a color filter and said fine pattern layer is an ink layer.

6. The patterned member as in claim 4, wherein:
   said patterned member is a wiring substrate and said fine pattern layer is a metal wiring layer.

* * * * *